United States Patent [19]
Fujita et al.

[11] Patent Number: 5,601,955
[45] Date of Patent: Feb. 11, 1997

[54] MASK PROTECTIVE DEVICE

[75] Inventors: Minoru Fujita; Hiroaki Nakagawa, both of Yamaguchi-ken, Japan

[73] Assignee: Mitsui Petrochemical Industries, Ltd., Tokyo, Japan

[21] Appl. No.: 513,518

[22] Filed: Aug. 10, 1995

[30] Foreign Application Priority Data

Aug. 11, 1994 [JP] Japan .................................. 6-189676
Jun. 15, 1995 [JP] Japan .................................. 7-147974

[51] Int. Cl.⁶ .................................................. G03F 9/00
[52] U.S. Cl. .............................. 430/5; 428/14; 428/422
[58] Field of Search ........................... 430/5; 428/14, 428/422

[56] References Cited

U.S. PATENT DOCUMENTS

| | | | |
|---|---|---|---|
| 4,833,051 | 5/1989 | Imamura | 430/5 |
| 5,344,677 | 9/1994 | Hong | 428/14 |

FOREIGN PATENT DOCUMENTS 5005982 1/1993 Japan .
6161094 6/1994 Japan .

OTHER PUBLICATIONS

*Research Disclosures*, Dec. 1986, Havants, Hants, UK, p. 715, abstract No. 27231.

*Primary Examiner*—S. Rosasco
*Attorney, Agent, or Firm*—Birch, Stewart, Kolasch & Birch, LLP

[57] ABSTRACT

An opening end face of a frame is closed by a transparent thin film, a vent is formed in the frame, and a filter having a filtration area larger than the sectional area of the vent is mounted to the frame to cover the vent. The filtration area of the filter is an effective area that allows the passage of gas in the filter. Then, the filter is mounted to the frame so that there is a certain space between the frame and the filter. In the conventional device, since the filter is directly mounted to the frame without space between the filter and the frame, the filtration area of the filter is substantially the same as the sectional area of the vent. In case of mounting the filter apart from the frame, however, the filtration area of the filter can be lager than the sectional area of the vent so that the quantity of gas flow is greater than that of the conventional one. Therefore, its adaptability to the changes in atmospheric pressure and in temperature is also improved.

13 Claims, 3 Drawing Sheets

MASK PROTECTIVE DEVICE

BACKGROUND OF THE INVENTION

The present invention relates to a mask protective device for preventing sticking of dust and other particles on a mask or a reticle (hereinafter, referred to as the "mask") which is used for photolithography in manufacturing processes of an integrated circuit.

The term "mask" means an original plate used for transferring a designed layout pattern onto a semiconductor wafer in the process of photolithography.

If dust or other particles stick on the mask in the process of photolithography, the dust or particles are also projected onto the semiconductor wafer. This may be a cause of producing defectives. In order to solve this problem and prevent sticking of dust and other particles on the mask, a mask protective device is used.

The mask protective device comprises a frame, the size of which is set to surround the layout pattern of the mask, and a transparent thin film closing one opening end face of the frame. The mask protective device is mounted to the mask by bonding the other opening end face of the frame to the mask with bonding means such as an adhesive tape. The mask is then covered by the thin film disposed apart from the mask, thereby protecting the mask from dust and other particles.

As the mask protective device is bonded on the mask as mentioned above, however, the airtightness in the device is quite high so that the thin film sometimes swells or dents due to change in atmospheric pressure or in temperature. The swell or dent in the thin film may change the optical characteristics of the thin film and/or, in case of severely swelling or denting, damage the thin film by that the thin film comes in contact with the mask or a lid of a casing which accommodates the mask and the mask protective device therein.

In order to solve the aforementioned problem, Utility Model Publication No. S63(1988)-39703 (U.S. Pat. No. 4,833,051) discloses a mask protective device which has a frame provided with at least one vent which is closed by a filter to prevent trespassing of dust or other particles. According to this mask protective device, the mask protective device has gas permeability even when it is mounted to the mask, thereby avoiding the swell and dent in the thin film due to the change in atmospheric pressure or in temperature.

However, in the mask protective device of the aforementioned Utility Model, since the filter is bonded directly on the outer surface of the frame to close the vent, its quantity of gas flow is relatively small and its adaptability to the changes in atmospheric pressure and in temperature is not so well.

SUMMARY OF THE INVENTION

The present invention is achieved to improve such a mask protective device having a frame provided with a vent to improve its adaptability to the changes in atmospheric pressure and in temperature.

For improving the adaptability, there is an idea of increasing the sectional area of the vent or increasing the number of vents. However, an increase in sectional area is not preferable because it causes a loss in the strength of the frame so that the frame may be easily deformed when the frame is pressed on the mask to mount the mask protective device to the mask. An increase in the number of vents is also not preferable because more man-hours are needed to make vents and to bond filters to the vents, respectively.

It is an object of the present invention to provide a mask protective device which allows for an increased gas flow to pass through a filter by increasing the filtration area of the filter, thereby improving its adaptability to the changes in atmospheric pressure and in temperature.

One of the mask protective devices of the present invention comprises (a) a frame having a size to surround a layout pattern on a mask, (b) a thin film mounted to cover one opening end face of the frame, (c) a bonding means for bonding the other opening end face of the frame on the mask, (d) a vent formed in the frame to communicate the inside of the frame with the outside of the frame, and (e) a filter means having a filtration area larger than the sectional area of the vent and mounted on the frame to cover the vent so that there is a certain space between the frame and the filter means.

It should be noted that the filtration area of the filter means an effective area that allows the passage of gas in the filter means.

Though the sectional configuration of the vent is generally a circle or a rectangle, it is not limited to these and may be an ellipse or a polygon.

The configuration of the frame is not limited but in a closed loop shape with both opening ends and may be a cylindrical tubular shape, a rectangular tubular shape, or the like.

In case where the distance between the filter means and the frame is too short, there is a possibility of deforming the filter means and pressing it to the frame due to the difference in pressure between the inside and the outside of the frame when the difference is large, whereby the effective filtration area of the filter means is decreased. In order to avoid the problem as mentioned above and to prevent the swelling of the thin film of the mask protective device due to changes in temperature and in pressure, the distance between the filter means and the frame may be 50 μm or more, preferably between 50 μm and 1000 μm, more preferably between 100 μm and 500 μm.

The aforementioned filter means may be mounted on the frame using a spacer of which both surfaces are provided with second bonding means. Therefore, by setting the thickness of the spacer to a desired size, the filter means can be easily spaced apart from the frame by a desired distance.

In this mask protective device, since the filtration area of the filter means is set to be larger than the sectional area of the vent and there is a certain space between the filter means and the frame, the quantity of gas flow is remarkably greater than that of the conventional one. As a result, its adaptability to the changes in atmospheric pressure and in temperature is also improved so that neither swell nor dent occurs on the thin film of the mask protective device.

The increase of the filtration area of the filter means reduces the possibility of blinding of the filter means due to dust and/or other particles.

Another one of the mask protective devices of the present invention comprises (a) a frame having a size to surround a layout pattern on a mask, (b) a thin film mounted to cover one opening end face of the frame, (c) a bonding means for bonding the other opening end face of the frame on the mask, (d) a vent formed in the frame and opening either inner or outer surface of the frame, (e) a recess formed in the other surface of the frame, having a sectional area larger than that of the vent, and communicating to the vent, and (f) a filter means mounted to the frame to cover the recess.

The configuration of the section of the aforementioned recess is not limited and may be a circle or a rectangle. The sectional area of the recess may be the same through its entire depth or may be increased toward its opening. In any cases, the depth of the recess must be set not to lose the strength of the frame. In general, the depth of the recess is preferably between 0.05 mm and 1.5 mm.

In this mask protective device, since the frame is provided with the recess having a sectional area larger than that of the vent and the filter means is mounted to cover the recess, the filtration area of the filter means is increased so that the quantity of gas flow is remarkably greater than that of the conventional one. As a result, its adaptability to the changes in atmospheric pressure and in temperature is also improved so that neither swell nor dent occurs on the thin film of the mask protective device.

The increase of the filtration area of the filter means reduces the possibility of blinding of the filter means due to dust and/or other particles.

In case of this mask protective device, the filter means can be mounted to the frame without the space between the frame and the filter means, thereby reducing the amount of projection of the filter means from the frame.

Still another one of the mask protective devices of the present invention comprises (a) a frame having a size to surround a layout pattern on a mask, (b) a thin film mounted to cover one opening end face of the frame, (c) a bonding means for bonding the other opening end face of the frame on the mask, (d) a vent formed in the frame to communicate the inside of the frame to and the outside of the frame, (e) a filter supporting frame formed in a tubular shape having a bottom plate, the bottom plate mounted to the frame and provided with a through hole communicating to the vent, the opening end of the filter supporting frame having an opening area larger than the sectional area of the vent, and (f) a filter means mounted to the opening end of the filter supporting frame to cover the opening thereof.

The configuration of the section of the aforementioned filter supporting frame is not limited and may be a circle or a rectangle.

The sectional area of the through hole is preferably substantially the same as or larger than the sectional area of the vent.

In this mask protective device, since the filter means is mounted to the opening end of the filter supporting frame having the opening area lager than the sectional area of the vent, the filtration area of the filter means is increased so that the quantity of gas flow is remarkably greater than that of the conventional one. As a result, its adaptability to the changes in atmospheric pressure and in temperature is also improved so that neither swell nor dent occurs on the thin film of the mask protective device.

The increase of the filtration area of the filter means reduces the possibility of blinding of the filter means due to dust and/or other particles.

In case of this mask protective device, the filter means can be spaced apart from the frame by a desired distance by changing the height of the filter supporting frame.

In case where the filter supporting frame is made of a rigid material, the filter supporting frame can be easily bonded to the frame by pinching it and pushing it to the frame.

In any one of the aforementioned mask protective devices, the bonding means for bonding the frame to the mask may be adhesive layers or a pressure sensitive adhesive double coated tape provided with adhesive faces on both surfaces thereof. It is not inevitable but convenient for handling that an adhesive surface to be bonded to the mask is protected by a released paper, which is released from the aforementioned adhesive surface just to be exposed the adhesive surface before bonding it to the mask.

In any one of the aforementioned mask protective devices, it is preferable in view of ease of mounting and in view of decreasing the effect of dust pollution due to the filter means that the filter means is mounted outside of the frame.

In any one of the aforementioned mask protective devices, the filtration area of the filter means may be 2 to 5000 times, preferably 5 to 3000 times, more preferably 10 to 2000 times of the sectional area of the vent.

DESCRIPTION OF THE PREFERRED EMBODIMENTS

Hereinafter, preferred embodiments of the present invention will be described with reference to the drawings.

First Embodiment

Figure 1:
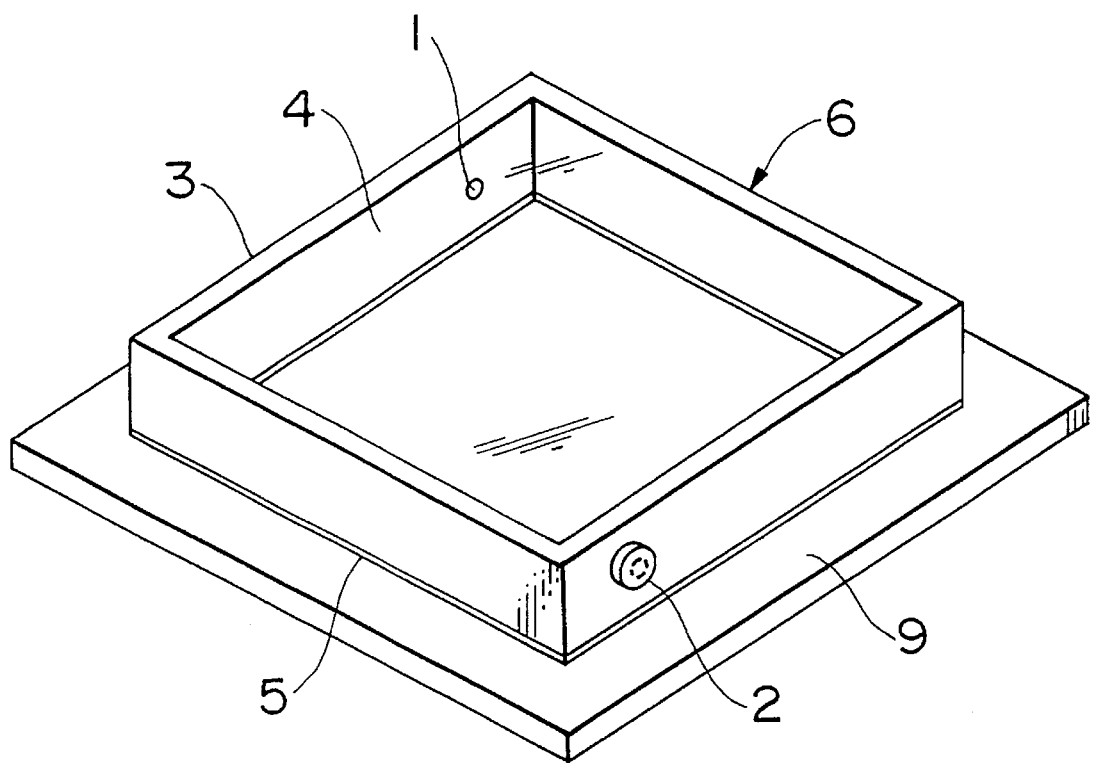
FIG. 1 is a perspective view of a mask protective device according to a first embodiment of the present invention.
Figure 2:
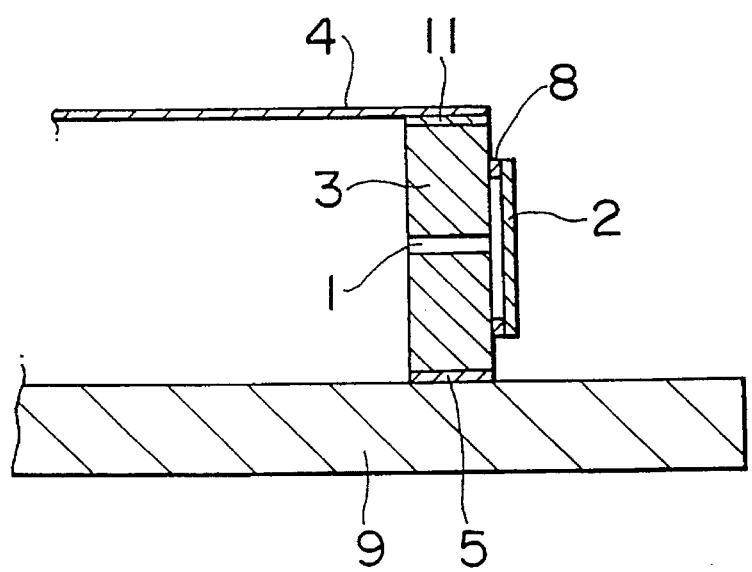
FIG. 2 is a sectional view showing the main part of the mask protective device according to the first embodiment of the present invention.
Figure 3:
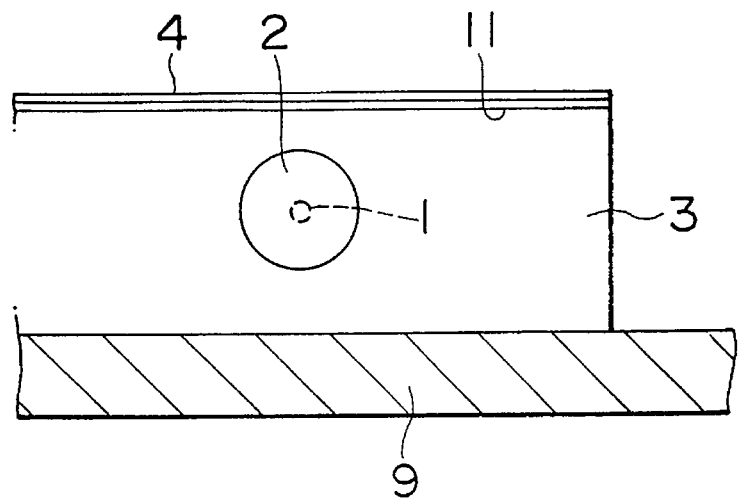
FIG. 3 is a front view showing the main part of the mask protective device according to the first embodiment of the present invention.

Referring to FIG. 1 through FIG. 3, a first embodiment of a mask protective device according to the present invention will be described.

A mask protective device 6 comprises a frame 3 which is composed of a rectangular tubular wall having a size to surround a layout pattern on a mask 9, a transparent thin film bonded on an upper end face of the frame 3 by adhesives 11 to close an upper opening, a pressure sensitive adhesive double coated tape (bonding means) 5 one surface of which is bonded on a lower end face of the frame 3 and the other surface of which is provided with a released paper, a vent 1 formed in a side face of the frame 3, and a circular filter (filter means) 2 for filtering off dust and other particles which is mounted on an outer surface of the frame 3 by a ring-shaped pressure sensitive adhesive double coated tape 8 surrounding the vent 1.

The mask protective device 6 is mounted to the mask 9 by releasing the released paper from the pressure sensitive adhesive double coated tape 5, positioning the frame 3 to surround the layout pattern on the mask 9, and pressing the adhesive coated surface of the pressure sensitive adhesive double coated tape 5 exposed by releasing the released paper as mentioned above against the mask 9.

In this embodiment, there is a certain space between the filter 2 and the outer surface of the frame 3 since the filter 2 is mounted to the outer surface of the frame 3 by the pressure sensitive adhesive double coated tape 8. Therefore, the effective area, where allows the passage of gas, in the filter 2, that is, the filtration area of the filter 2 is remarkably increased as compared with the conventional one in which the filter is bonded directly on the outer surface of the frame so that there is no space between the filter and the outer surface of the frame.

Assuming that the filtration area of the filter 2 is represented by $A(m^2)$ and the rate of gas flow passing through the filter 2 is represented by $K(m/sec)$, the quantity of gas flow passing through the filter $Q(m^3/sec)$ is given by expression $Q=A.K$. In other word, The quantity of gas flow Q is increased in proportion to the increase of the filtration area of the filter.

If the filter is directly bonded on the outer surface of the frame to cover the vent as the conventional one, since the sectional area of the vent is $a(m^2)$, the filtration area of the filter is also substantially $a(m^2)$.

Since $A>a$, the quantity of gas flow in the mask protective device 6 of this embodiment is greater than that of the conventional one. Therefore, in its adaptability to the changes in atmospheric pressure and in temperature, the mask protective device 6 of this embodiment is still superior to the conventional one.

In addition, the increase of the filtration area of the filter 2 reduces the possibility of blinding of the filter 2 due to dust and/or other particles.

Second Embodiment

Figure 4:
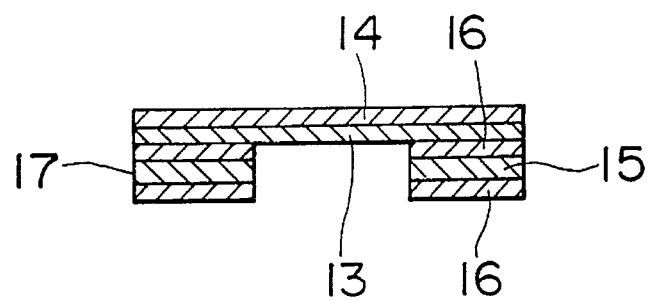
FIG. 4 is a sectional view of a filter used in a mask protective device according to a second embodiment of the present invention.
Figure 5:
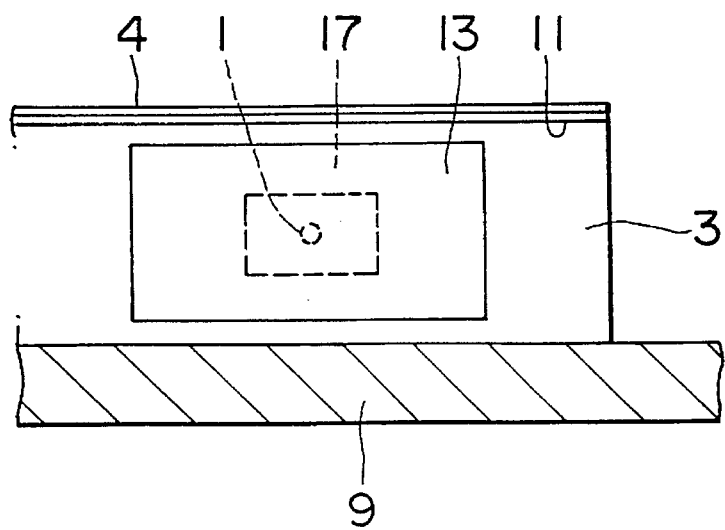
FIG. 5 is a front view showing the main part of the mask protective device according to the second embodiment of the present invention.

Referring to FIG. 4 and FIG. 5, a second embodiment of the mask protective device according to the present invention will be described. The following description will be omitted in part by using same reference numerals for designating the same elements as the first embodiment and made as regard to the differences between the first embodiment and the second embodiment.

As shown in FIG. 4 and FIG. 5, a filter 13 in this embodiment is formed in a rectangle, laminated with a protective net 14 on a top surface thereof, and provided with a pressure sensitive adhesive double coated tape 17 on a bottom surface thereof. The pressure sensitive adhesive double coated tape 17 comprises a reinforcing base (spacer) 15 and adhesive layers (second bonding means) 16 on the both surfaces of the reinforcing base 15.

As shown in FIG. 5, the filter 13 is positioned to allow the pressure sensitive adhesive double coated tape 17 to surround the periphery of the vent 1 and bonded on the outer surface of the frame 3 by the pressure sensitive adhesive double coated tape 17.

In this second embodiment, the inside of the pressure sensitive adhesive double coated tape 17 in the filter 13 is a portion allowing the passage of gas. The area of this portion is the filtration area of the filter 13. The filtration area is set to be larger than the sectional area of the vent 1.

Also in the second embodiment, there is a certain space between the filter 13 and the outer surface of the frame 3 since the filter 13 is mounted to the outer surface of the frame 3 by the pressure sensitive adhesive double coated tape 17. Therefore, the filtration area of the filter 13 is remarkably increased as compared with the conventional one in which the filter is bonded directly on the outer surface of the frame so that there is no space between the filter and the outer surface of the frame.

Therefore, the quantity of gas flow in the mask protective device of the second embodiment is greater than that of the conventional one, thereby still improving its adaptability to the changes in atmospheric pressure and in temperature as compared to the conventional one.

Third Embodiment

Figure 6:
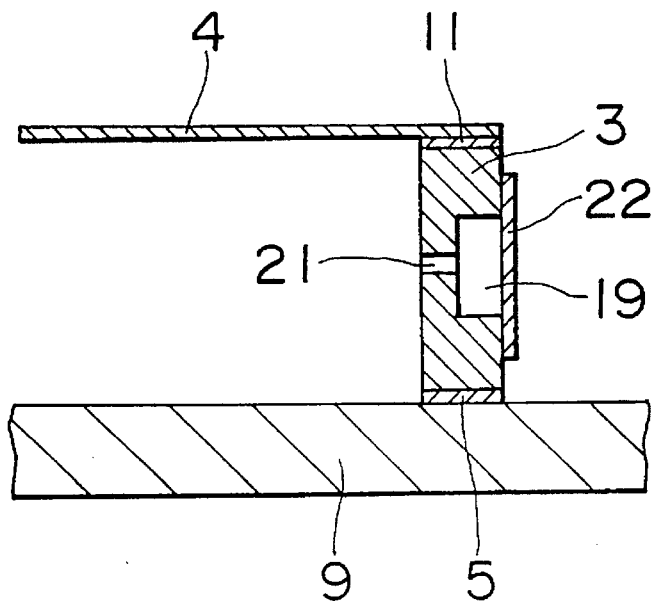
FIG. 6 is a sectional view showing the main part of a mask protective device according to a third embodiment of the present invention.

Referring to FIG. 6, a third embodiment of the mask protective device according to the present invention will be described. The following description will be omitted in part by using same reference numerals for designating the same elements as the first embodiment and made as regard to the differences between the first embodiment and the third embodiment.

In a mask protective device of the third embodiment, the frame 3 is provided with a circular or rectangular recess 19 formed in the outer surface thereof, a vent 21 is formed in a bottom surface of the recess 19, a filter 22 is directly bonded on the peripheral edge of the recess 19 by adhesives, and the filter 22 covers the opening of the recess 19.

Since the recess 19 is formed in the outer surface of the frame 3 in the third embodiment, the filtration area of the filter 22 is substantially the same as the end face area of the opening of the recess 19 and therefore is larger than the sectional area of the vent 21.

Therefore, the quantity of gas flow in the mask protective device of the third embodiment is greater than that of the conventional one, thereby still improving its adaptability to the changes in atmospheric pressure and in temperature as compared to the conventional one.

Fourth Embodiment

Figure 7:
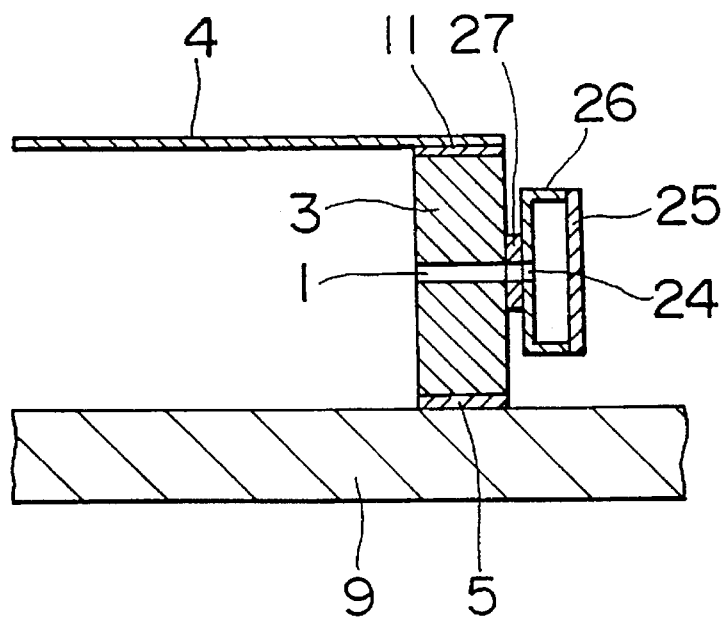
FIG. 7 is a sectional view showing the main part of a mask protective device according to a fourth embodiment of the present invention.

Referring to FIG. 7, a fourth embodiment of the mask protective device according to the present invention will be described. The following description will be omitted in part by using same reference numerals for designating the same elements as the first embodiment and made as regard to the differences between the first embodiment and the fourth embodiment.

In the fourth embodiment, a filter supporting frame 26 with a bottom plate which is formed like a cylindrical or rectangular tube is bonded on the frame 3 by adhesives 27, the filter supporting frame 26 is provided with a through hole 24 formed in the bottom plate thereof, which is formed concentrically with the vent 1 of the frame 3 and has substantially the same inner diameter as that of the vent 1, a filter 25 is bonded to the opening end face of the filter supporting frame 26 to close the opening end face.

In this embodiment, the filtration area of the filter 25 is substantially the same as the area of the opening end face of the filter supporting frame 26 and therefore is larger than the sectional area of the vent 1.

Therefore, the quantity of gas flow in the mask protective device of the fourth embodiment is greater than that of the conventional one, thereby still improving its adaptability to the changes in atmospheric pressure and in temperature as compared to the conventional one.

Comparative Tests

Comparative tests of the mask protective device of the present invention and the conventional mask protective device has been made. As for the comparative tests, the mask protective device of the second embodiment as shown in FIG. 4 and FIG. 5 has been used as the mask protective device of the present invention. The followings are the results of the comparative tests.

In Case of the Mask Protective Device of the Present Invention

The specification of the mask protective device of the second embodiment used in this comparative tests was as follows: the size of the frame 3 was 120 mm deep, 98 mm wide, and 6.3 mm high, the inner diameter of the vent 1 was 0.5 mm, and the filter 13 was made of PTFE (polytetrafluoroethylene) and, to be concrete, was "Photomask Vent™" from Japan Gore-Tex Inc.

As shown in FIG. 5, the aforementioned filter 13 was mounted to the frame 3 by the pressure sensitive adhesive double coated tape 17 to cover the vent 1 to complete the mask protective device which was then mounted to the mask 9. At this point, the space between the filter 13 and the outer surface of the frame 3 was 150 μm and the filtration area of the filter 13 was 3.2 mm².

The mask 9 which the mask protective device had been mounted to was put into a heating furnace and was then heated from the room temperature 25° C. up to 50° C. taking 15 minutes. As a result, neither swell nor dent occurred on the thin film 4.

In Case of the Conventional Mask Protective Device

The filter of the conventional mask protective device was the same as the aforementioned filter 13, that is, was made of PTFE and, to be concrete, was "Photomask Vent™" from Japan Gore-Tex Inc.

The filter is directly bonded on the outer surface of the frame to cover the vent, the inner diameter of which was 0.5 mm. At this point, the distance between the filter and the outer surface of the frame was 10 μm and the filtration area of the filter was 0.2 mm² which was substantially the same as the sectional area of the vent.

The mask which the conventional mask protective device had been mounted to was put into the heating furnace and was then heated from the room temperature 25° C. up to 50° C. taking 15 minutes as just like the aforementioned heating condition. As a result, a dent occurred on the thin film of the conventional mask protective device. To remove the dent, it took more than 50 minutes in a state of letting the device in the temperature 50° C.

What we claim:

1. A mask protective device comprising:
   (a) a frame having a size to surround a layout pattern on a mask;
   (b) a thin film mounted to cover one opening end face of said frame;
   (c) a bonding means for bonding the other opening end face of said frame on the mask;
   (d) a vent formed in the frame to communicate the inside of said frame to the outside of said frame; and
   (e) a filter means having a filtration area larger than the sectional area of said vent and mounted on the frame to cover said vent so that there is a certain space between said frame and said filter means.

2. A mask protective device as claimed in claim 1, wherein said filter means is mounted on said frame using a spacer of which both surfaces are provided with second bonding means.

3. A mask protective device as claimed in claim 1, wherein said filter means is mounted outside of said frame.

4. A mask protective device as claimed in claim 1, wherein the distance between said filter means and said frame is 50 μm or more.

5. A mask protective device as claimed in claim 1, wherein the filtration area of said filter means is 2 to 5,000 times that of the sectional area of the vent.

6. A mask protective device comprising:
   (a) a frame having a size to surround a layout pattern on a mask;
   (b) a thin film mounted to cover one opening end face of said frame;
   (c) a bonding means for bonding the other opening end face of said frame on the mask;
   (d) a vent formed in said frame and opening either inner or outer surface of said frame;
   (e) a recess formed in the other surface of said frame, having a sectional area larger than that of said vent, and communicating to said vent; and
   (f) a filter means mounted to said frame to cover said recess.

7. A mask protective device as claimed in claim 6, wherein the depth of said recess is 1.5 mm or less.

8. A mask protective device as claimed in claim 6, wherein said filter means is mounted outside of said frame.

9. A mask protective device as claimed in claim 6, wherein the filtration area of said filter means is 2 to 5,000 times that of the sectional area of the vent.

10. A mask protective device comprising:
    (a) a frame having a size to surround a layout pattern on a mask;
    (b) a thin film mounted to cover one opening end face of said frame;
    (c) a bonding means for bonding the other opening end face of said frame on the mask;
    (d) a vent formed in the frame to communicate the inside of said frame to the outside of said frame;
    (e) a filter supporting frame formed in a tubular shape having a bottom plate, said bottom plate mounted to said frame and provided with a through hole communicating to said vent, the opening end of said filter supporting frame having an opening area larger than the sectional area of said vent; and
    (f) a filter means mounted to said opening end of said filter supporting frame to cover the opening thereof.

11. A mask protective device as claimed in claim 10, wherein the sectional area of said through hole of said filter supporting frame is substantially the same as or larger than the sectional area of said vent.

12. A mask protective device as claimed in claim 10, wherein said filter means is mounted outside of said frame.

13. A mask protective device as claimed in claim 10, wherein the filtration area of said filter is 2 to 5,000 times that of the sectional area of the vent.

* * * * *